(12) United States Patent
Lee

(10) Patent No.: US 7,076,697 B2
(45) Date of Patent: Jul. 11, 2006

(54) METHOD AND APPARATUS FOR MONITORING COMPONENT LATENCY DRIFTS

(75) Inventor: Terry R. Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 259 days.

(21) Appl. No.: 10/667,388

(22) Filed: Sep. 23, 2003

(65) Prior Publication Data

US 2004/0059968 A1  Mar. 25, 2004

Related U.S. Application Data

(63) Continuation of application No. 10/054,909, filed on Jan. 25, 2002, now Pat. No. 6,665,823, which is a continuation of application No. 09/040,420, filed on Mar. 18, 1998, now Pat. No. 6,374,371.

(51) Int. Cl.
*G06F 11/00* (2006.01)
(52) U.S. Cl. ......................................... 714/55; 714/815
(58) Field of Classification Search ................. 714/55, 714/707, 744, 815, 758, 773, 780, 52, 766
See application file for complete search history.

(56) References Cited

U.S. PATENT DOCUMENTS

| | | | |
|---|---|---|---|
| 4,378,509 A | | 3/1983 | Hatchett et al. |
| 4,564,943 A | * | 1/1986 | Collins et al. ............... 714/745 |
| 4,577,318 A | * | 3/1986 | Whitacre et al. ........... 714/700 |
| 4,646,297 A | * | 2/1987 | Palmquist et al. .......... 714/700 |
| 4,837,521 A | * | 6/1989 | Herlein et al. ............... 327/261 |
| 5,278,974 A | | 1/1994 | Lemmon et al. |
| 5,444,859 A | | 8/1995 | Baker et al. |
| 5,488,309 A | * | 1/1996 | Farwell ....................... 324/617 |
| 5,533,037 A | | 7/1996 | Shah et al. |
| 5,579,326 A | * | 11/1996 | McClure ...................... 714/814 |
| 5,761,274 A | | 6/1998 | Uehara et al. |
| 5,809,034 A | * | 9/1998 | Rezvani et al. ............. 714/700 |
| 5,831,461 A | | 11/1998 | Dawe |
| 5,872,976 A | | 2/1999 | Yee et al. |
| 5,978,284 A | | 11/1999 | Pawlowski |
| 6,002,282 A | | 12/1999 | Alfke |
| 6,031,770 A | | 2/2000 | Pawlowski |
| 6,088,830 A | * | 7/2000 | Blomgren et al. .......... 714/814 |
| 6,092,030 A | * | 7/2000 | Lepejian et al. ............. 702/79 |
| 6,108,795 A | | 8/2000 | Jeddeloh |

(Continued)

OTHER PUBLICATIONS

400 Mb/s/pin SLDRAM, CONS400.PG5-Rev. Sep. 22, 1997.

(Continued)

*Primary Examiner*—Bryce P Bonzo
(74) *Attorney, Agent, or Firm*—Dickstein Shapiro Morin & Oshinsky LLP

(57) ABSTRACT

A method and apparatus for monitoring the response times of computer system components in order to improve computer system reliability and performance are provided. The method and apparatus are particularly applicable to computer systems with memory circuits, such as SLDRAMs, that have programmable response times. A response time monitoring circuit in the form of a phase detector includes a plurality of flip-flops with the data inputs commonly connected to receive a response ready signal from a component, such as a memory circuit, in response to a command to perform a task. Each clock input of the flip-flop is connected to a clock signal at a different phase of a response period. The outputs of the flip-flops determine the phase at which the response ready signal was generated by the component.

25 Claims, 7 Drawing Sheets

U.S. PATENT DOCUMENTS

| | | | |
|---|---|---|---|
| 6,151,682 A * | 11/2000 | van der Wal et al. | 713/401 |
| 6,184,753 B1 | 2/2001 | Ishimi et al. | |
| 6,192,092 B1 * | 2/2001 | Dizon et al. | 375/371 |
| 6,298,465 B1 * | 10/2001 | Klotchkov | 714/814 |
| 6,341,326 B1 | 1/2002 | Zhao et al. | |
| 6,370,200 B1 * | 4/2002 | Takahashi | 375/257 |
| 6,374,371 B1 | 4/2002 | Lee | |
| 6,421,801 B1 * | 7/2002 | Maddux et al. | 714/744 |
| 6,449,727 B1 | 9/2002 | Toda | |
| 6,560,716 B1 | 5/2003 | Gasparik et al. | |
| 6,577,175 B1 | 6/2003 | Kim | |
| 6,637,018 B1 * | 10/2003 | Demler | 716/18 |
| 6,665,823 B1 * | 12/2003 | Lee | 714/55 |
| 6,820,234 B1 * | 11/2004 | Deas et al. | 714/814 |
| 6,842,864 B1 * | 1/2005 | Hampel et al. | 713/401 |
| 2002/0046288 A1 | 4/2002 | Mantegna et al. | |
| 2002/0097822 A1 | 7/2002 | Mantegna et al. | |

OTHER PUBLICATIONS

Draft Standard for a High-Speed Memory Interface (SyncLink), Draft 0.99 IEEE P1596.7-199X, Sponsor Microprocessor and Microcomputer Standards Subcommittee of the IEEE Computer Society, Copyright 1996 IEEE.

* cited by examiner

Figure 1 - Signal Transition Phas D tector

Figure 2 - Clock Timing Diagram

READ AND WRITE COMMAND PACKET DEFINITION

| Flag | CA9 | CA8 | CA7 | CA6 | CA5 | CA4 | CA3 | CA2 | CA1 | CA0 |
|------|------|------|------|------|------|------|------|------|------|------|
| 0 | x | x | x | x | x | x | x | x | x | x |
| 1 | ID8 | ID7 | ID6 | ID5 | ID4 | ID3 | ID2 | ID1 | ID0 | CMD5 |
| 0 | CMD4 | CMD3 | CMD2 | CMD1 | CMD0 | BNK2 | BNK1 | BNK0 | ROW9 | ROW8 |
| 0 | ROW7 | ROW6 | ROW5 | ROW4 | ROW3 | ROW2 | ROW1 | ROW0 | 0 | 0 |
| 0 | 0 | 0 | 0 | COL6 | COL5 | COL4 | COL3 | COL2 | COL1 | COL0 |

Legend:

ID8-ID0 = Device ID Value
CMD5-CMD0 = Command Code
BNK2-BNK0 = Bank Address
x = don't care ROW9-ROW0 = Row Address
COL6-COL0 = Column Address
0 = Unused, apply 0 for this bit

Figure 4

METHOD AND APPARATUS FOR MONITORING COMPONENT LATENCY DRIFTS

CROSS REFERENCE TO RELATED APPLICATIONS

The present application is a continuation application of U.S. patent application Ser. No. 10/054,909, filed on Jan. 25, 2002 now U.S. Pat. No. 6,665,823, which in turn is a continuation of U.S. patent application Ser. No. 09/040,420 filed Mar. 18, 1998, now issued as U.S. Pat. No. 6,374,371 on Apr. 16, 2002, the disclosures of which are herewith incorporated by reference in their entirety.

BACKGROUND OF THE INVENTION

The present invention relates generally to a method and apparatus for monitoring the response times of computer system components for the purpose of improving computer system reliability. The invention has particular utility in monitoring the data retrieval response time of memory circuits to enable the identification of memory circuits whose data retrieval response times are drifting away from a desired response time.

As computers are increasingly being used in critical applications, reliability is of increasingly greater importance. One approach to improving computer system reliability is to increase the reliability of individual components of the system. However, this approach is not always possible or economical. What is needed is an approach that economically improves overall reliability of a system without requiring the use of improved individual components.

The response time of an electronic component is the time required for the component to respond to a request, or command, to perform a task. The component may provide a response ready signal or some other direct or indirect indication that the task has been completed. Such an indication is referred to herein as a response ready signal or a ready signal. The response time is also known as the latency. These terms are used interchangeably herein. In the context of memory circuits, the response time, or latency, of the memory circuit is that period from the time the memory circuit is commanded to retrieve stored data until the time that the memory circuit signals that the data is available. For example, the response time may be measured from the time a data read command is asserted by a controller until the time a data strobe, or any other signal or combination of signals indicating that the data is available, is issued.

Advanced memory circuits include provisions for adjusting their response times. For example, the response time of SDRAM (synchronous dynamic random access memory) memory circuits may be adjusted by whole clock cycle increments. A new type of DRAM circuit currently under development, the SLDRAM, can have its response time adjusted both by whole clock cycles and by a portion of a clock cycle. One suggested implementation task for a controller for SLDRAM memory circuits is that the response time for all SLDRAM memory circuits in a system be measured and the slowest response time be identified. The response time of each SLDRAM memory circuit would then be programmed to match the slowest measured response time so that the response time is equalized for all memory circuits, no matter which is performing a data retrieval operation. This process is referred to as calibration. Detailed information pertaining to calibration of SLDRAMs is contained in the respective specification for the particular SLDRAM memory circuit being calibrated. One such example is the 4 M×18 SLDRAM specification, CONS400.P65, Rev. Sep. 22, 1997, the contents of which are hereby incorporated by reference. The actual method for calibrating the SLDRAM memory circuits is beyond the scope of this invention.

Once all the SLDRAM component response times have been initially adjusted, or calibrated, the response times must be monitored to detect changes. Changes in response time are referred to as response time drifts or latency drifts. Latency drifts may be caused by many factors, including environmental conditions such as temperature and power supply fluctuations. Another possible cause for a change in the response time of an SLDRAM component is the onset of a failure. What is needed, therefore, is a controller that can monitor the response times of components, such as memory circuits, both to identify components that exhibit latency drift indications pointing to an approaching failure and to signal the need for recalibration when the components include programmable response delay capabilities.

SUMMARY OF THE INVENTION

The present invention meets the needs identified by providing a method and a response time monitoring circuit for monitoring the response time of computer system components. In a preferred embodiment, the response time measurement circuit is implemented as a phase detector. The phase detector determines where in a response time window a component such as a memory circuit completed a response after being commanded to do so. For a memory circuit the response is making the read data available following a read command.

The phase detector can be implemented using a plurality of simple transparent latches such as data flip-flops that are clocked by delayed phases of a system clock. A transparent latch is a memory storage device in which the data output of the device matches the data input while an enable (clock) signal is applied to a clock input, but remains stable when the enable (clock) signal is not applied regardless of changes to the input. The resolution of the phase detector simply depends upon the number of flip-flops and the differences between the system clock and the delayed versions thereof.

In one embodiment of the present invention, the phase detector forms part of a memory controller for use with SLDRAM or other memory chips. The phase detector is used to monitor latency drifts after the initial calibration and to alert a controller of any excessive latency drift that necessitates recalibration or possible replacement.

The phase detector may also be used to detect other components that are exhibiting changing latency drift behavior which may indicate an impending failure. Once suspect components are identified, the user may be alerted to perform preventive maintenance by replacing or rotating such a component within a system.

A method for improving the performance and reliability of a computer system is also provided. This method comprises of rotating interchangeable components, such as memory circuits, through a plurality of possible locations and determining both the most stable memory circuit and the location causing the worst latency drift. The location might cause latency drift if the location is such that the temperature is a relative extreme, such as a location in the system cabinet that is relatively hot because it does not receive adequate air flow. The delay may also be caused by position dependent power supply fluctuations. The most stable components are placed in the worst locations. Alternatively, interchangeable components may be rotated in and out of the problem location or locations to minimize the effects of the location on the component. These techniques improve the reliability of the system as a whole by minimizing the effects of poor component locations. System performance is also improved due to decreased need to perform calibration, which consumes system time.

Accordingly, one object of the invention is to provide a method and apparatus for monitoring the response time of components, for example, memory circuits, in a computer system.

Another object of the invention is to provide a method and apparatus for identifying components, for example, memory circuits, exhibiting changes in response time which may be indicative of an impending failure.

Another object of the invention is to provide a method and apparatus for identifying problem components and their locations in a computer system.

Another object of the invention is to provide a method and apparatus for identifying components with superior response times and locating these components in locations that are most frequently accessed.

These and other objects, advantages and features of the invention may be best be understood with reference to the following detailed description of preferred embodiments of the invention, the appended claims and the several drawings attached hereto.

BRIEF DESCRIPTION OF THE DRAWINGS

FIG. 4 is a format diagram of an SLDRAM command packet output by the memory controller of FIG. 4;

DETAILED DESCRIPTION OF PREFERRED EMBODIMENTS

The invention will be described and illustrated below with particular reference to its use in measuring the latency drift of memory circuits, for example SLDRAMs. However, the invention is not limited to this particular use, as it may be used to measure and record the response time of any electronic component for analysis and use in reliability studies.

Figure 1:
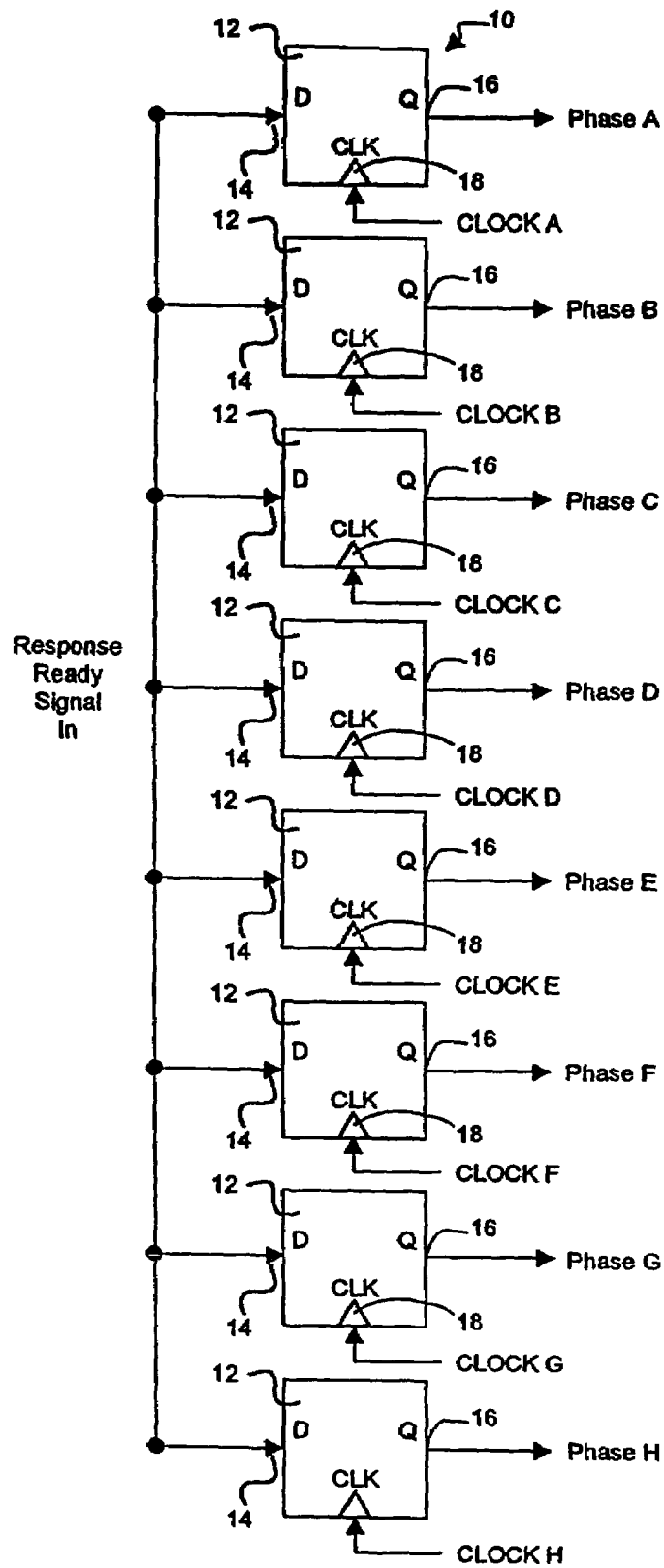
FIG. 1 is a circuit diagram of a phase detector which may be used in the present invention.

Referring now to the drawings, where like elements are designated by like reference numerals, there is shown in FIG. 1 a response time measurement circuit in the form of a phase detector 10 which may be used in one embodiment of the present invention. The phase detector 10 includes a plurality of data flip-flops 12 each with data inputs 14, data outputs 16, and clock inputs 18. The data output 16 of a data flip flop 12 will reflect the data present at the data input 14 after a clock pulse is received at the clock input 18. When measuring the response time of a memory circuit, each data input 14 is connected to a RESPONSE READY SIGNAL (which is directly related to the latency or from which the latency can be derived) generated by the memory circuit (not shown in FIG. 1) whose response time is being measured. Memory circuits generate a RESPONSE READY SIGNAL in the form of a data ready strobe that signifies the availability of the requested data after a data read request and at the completion of a data retrieval operation. In this example, the RESPONSE READY SIGNAL is active high.

Figure 2:
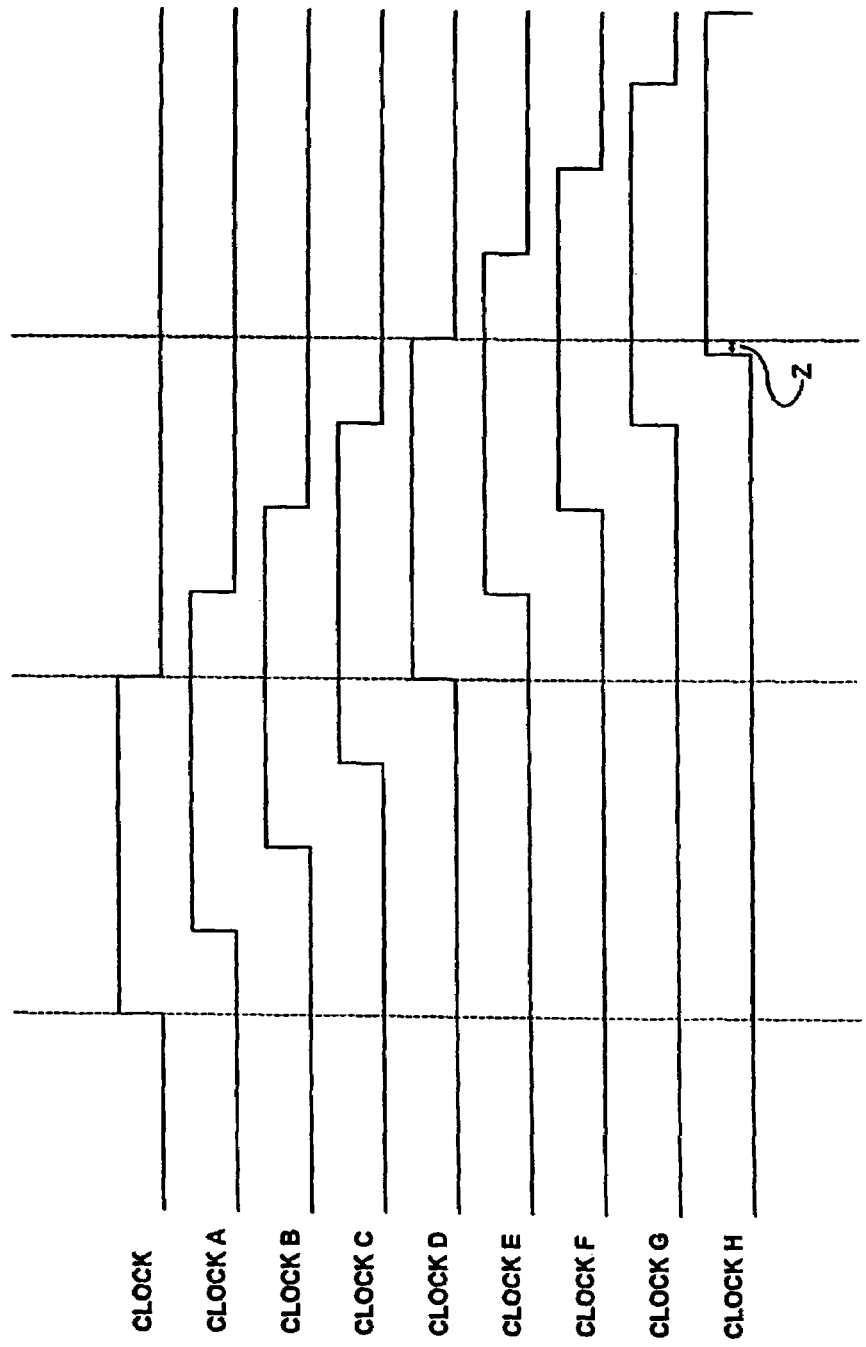
FIG. 2 is a timing diagram of the various clock signals input to the phase detector of FIG. 1.

Each clock input 18 of the data flip-flops 12 is clocked by a separate clock input CLOCK A through CLOCK H. The flip-flops 12 are enabled at the rising edge of a clock signal. The relationship of the various CLOCKs A through H in relation to a master CLOCK signal is shown in FIG. 2. The master CLOCK signal is generated by a controller at the earliest point in time at which a response from a memory circuit is expected. The master CLOCK signal thus forms the start of a window of time during which a response from the memory circuit is expected. The first clock signal, CLOCK A, is a delayed version of the master CLOCK signal. The second clock signal, CLOCK B, is a delayed version of the CLOCK A signal. Similarly, clocks C through H are delayed versions of the preceding clocks B through G, respectively. The final clock signal, CLOCK H, is a delayed version of CLOCK G with a delay chosen such that the rising edge of CLOCK H occurs a small period Z before the end of the response window. The period Z is chosen such that the output of the last data flip-flop 12 is ready at the end of the response window.

The clock signal delays shown in FIG. 2 are chosen such that the rising edges of the clock signals are evenly distributed throughout the entirety of one master CLOCK period for controlling a memory circuit such as an SLDRAM circuit. The positioning of the CLOCK signals, however, is a matter of design choice and application. The signals do not have to be evenly positioned throughout the clock period, nor do they have to be positioned over the entirety of the period. Where synchronous components with response times varying by more than 1 master clock cycle are to be controlled, the clock signals may be distributed over multiple master clock cycles. A still different distribution may be used for asynchronous devices. Similarly, the number of flip-flops is also a matter of design choice and application. Finally, a phase detector may be implemented with devices other than flip-flops. The particular implementation of the phase detector is also a matter of design choice.

Referring back to FIG. 1, it will be apparent that the output of each data flip-flop 12 will output a "1" at data output 16 if the RESPONSE READY SIGNAL was present before the respective clock signal was received by each data flip-flop 12, and will output a "0" if the RESPONSE READY SIGNAL was not present before respective clock signal. By examining the outputs of all data flip-flops 12, it is possible to determine during which portion of a master CLOCK cycle the RESPONSE READY SIGNAL was received. The first portion of the master CLOCK cycle during which a RESPONSE READY SIGNAL is received is referred to herein as the phase of the response.

Examples of possible phase detector 10 outputs and their assigned severity are shown in the following table:

TABLE 1

| PHASE | A | B | C | D | E | F | G | H |
|---|---|---|---|---|---|---|---|---|
| Initial Calibration | 0 | 0 | 0 | 0 | 1 | 1 | 1 | 1 |
| Access Time Decreasing (Severe) | 0 | 1 | 1 | 1 | 1 | 1 | 1 | 1 |

TABLE 1-continued

| PHASE | A | B | C | D | E | F | G | H |
|---|---|---|---|---|---|---|---|---|
| Access Time Increasing (Severe) | 0 | 0 | 0 | 0 | 0 | 0 | 1 | 1 |
| Access Time Decreasing (Moderate) | 0 | 0 | 1 | 1 | 1 | 1 | 1 | 1 |
| Access Time Increasing (Moderate) | 0 | 0 | 0 | 0 | 0 | 1 | 1 | 1 |

The first row of the table shows the output of the phase detector for a component, here a memory circuit, that has just been calibrated. As shown, it is expected that the RESPONSE READY SIGNAL will be received approximately in the middle of a master CLOCK cycle. Thus, the flip-flops 12 clocked by CLOCKS A–C will have "0" output. Because the rising edge of CLOCK D occurs essentially at the mid-point of the master CLOCK signal, the output of the flip-flop 12 clocked by CLOCK D may be a "0" or a "1". This result is not of concern, however, as drifts of a single phase or less are not of concern. The flip-flop 12 clocked by CLOCK E will have a "1" output because the RESPONSE READY SIGNAL occurs well before the rising edge of CLOCK E signal. The remaining flip-flops 12 also have "1" outputs.

The second row illustrates a severe decrease in response time, signifying that the RESPONSE READY SIGNAL is occurring much earlier than desired. An early response can be as much of a problem as a late response when multiple devices share a data bus.

Referring back to row 2 of the table, it can be seen that the early response occurred between the rising edges of phases A and B. Row 4 of the table also shows a decreasing response time, although the here the decrease is not as severe as that shown in row 2. Similarly, row 3 shows a severe increase in response time, while row 5 shows a more moderate increase.

By monitoring the phase A to H outputs of the flip-flops 12 of the phase detector 10 for different memory circuits, a memory controller can determine how the respective memory circuits are responding to data retrieval commands. An exemplary system for doing this is now described.

Figure 3:
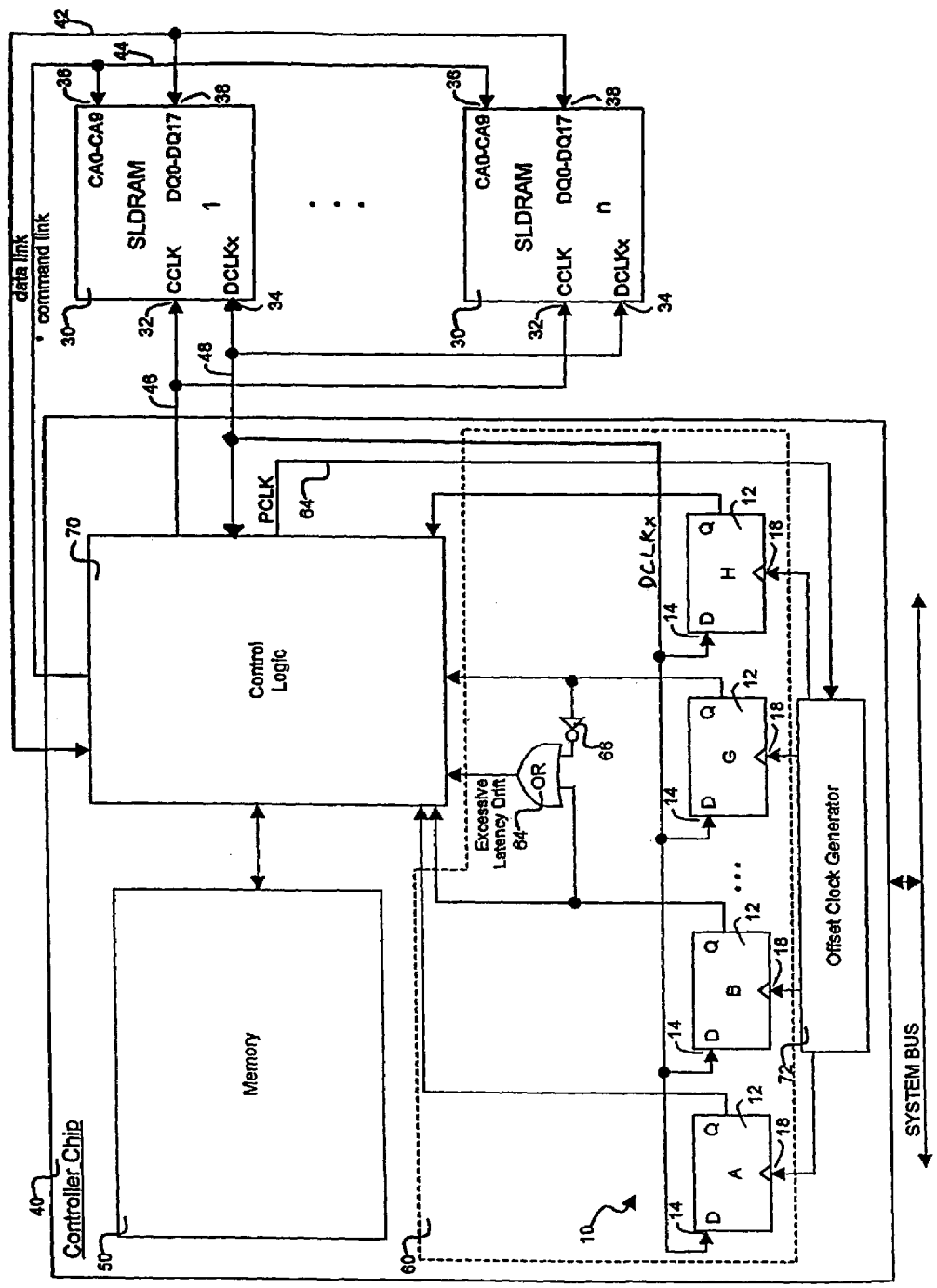
FIG. 3 is a circuit diagram of an SLDRAM memory circuit controller incorporating the phase detector of FIG. 1.

FIG. 3 depicts the phase detector 10 of FIG. 1 integrated into a controller 40 for monitoring SLDRAM memory circuits 30. The controller 40 is shown as a separate chip in FIG. 3, but may integrated together with other electronic circuits if desirable.

A simplified description of the operation of an SLDRAM memory circuit and controller now follows. For a more complete description of the operation and control of an SLDRAM, reference should be made to the DRAFT STANDARD FOR A HIGH-SPEED MEMORY INTERFACE (SYNC-LINK), Draft 0.99 IEEE P1596.7-199X, the contents of which are hereby incorporated by reference. The functions described below are performed by the control logic 70. As used herein, the control logic is intended to encompass dedicated low level logic, a processor, or any combination of the two. The actual implementation is dependent upon the environment and application and is a matter of engineering judgment.

A subset of the connections between the SLDRAM memory circuit 30 and the controller 40 are shown including a command link 44, a data link 42, a master clock (CCLK) signal 46 and a data clock signal (DCLKx) signal 48. When the controller 40 wishes to communicate with an SLDRAM memory circuit 30, such as to perform a write or read operation, or to adjust the response time as part of the aforementioned calibration process, a command packet is sent from the control logic 70 to an addressed SLDRAM memory circuit via the command link 44. An example of a command packet is shown in FIG. 4. The command packet is a set of four 10 bit words that specify the command. The command packet contains fields for specifying the unique identification number of the SLDRAM memory circuit 30 to which a command pertains (ID0–ID8); the type of operation (CMD0–CMD5); and the bank, row, and column on the SLDRAM memory circuit 30 to which the command applies (BNK0–BNK2, ROW0–ROW9, and COL0–COL9). The SLDRAM memory circuit 30 is internally organized into 8 banks of 128K 72 bit words, with each bank organized into 1024 rows by 128 columns. The Flag bit shown in FIG. 4 is a separate signal on the command link that is used to indicate the start of a command packet to the SLDRAM memory circuit 30.

Referring back to FIG. 3, the data link 42 is used to transfer data to and from the SLDRAM memory circuit 30. For example, in response to a read command packet, the SLDRAM memory circuit places the contents of the requested memory cells on the data link 42. The SLDRAM memory circuit 30 then asserts the DCLKx signal to alert the controller 40 that the data is present. The data is sent without any header or other identifying information. The controller 40 is able to identify the SLDRAM memory circuit 30 from which the data originated because the controller 40 itself has previously issued the read command packet and knows on which clock cycle the response is expected as the controller 40 has previously calibrated the SLDRAM memory circuits 30 and thus knows the latency, that is, how long is should take for the DCLKx signal to be generated. The DCLKx signal 46 functions as the RESPONSE READY SIGNAL discussed in connection with FIG. 2. The CCLK signal is supplied by the controller 40 as the master clock for all SLDRAM memory circuits 30. It should be noted that the CCLK and DCLKx signals 46, 48 are actually differential signals, and that the DCLKx signal 48 actually represents two separate differential clock signals that are alternately used in actual operation. These signals are shown as single signals for ease of representation.

The DCLKx signal 48 (or a derivative of this signal), besides being input to the control logic 70, is also input to the data input 14 of each of the flip-flops 12. Each of the flip-flops 12 is clocked by one of a set of separate clock signals, CLOCK A through CLOCK H. The clock signals are produced by an offset clock generator 72 which, although shown apart from the control logic 70, is a part thereof. A clock signal PCLK 68 is provided by the control logic 70 at the earliest time a response is expected from an SLDRAM memory circuit 30. The offset clock generator 72 simply adds varying delays to the PCLK signal 68 to produce the clock signals CLOCK A through CLOCK H input to the flip-flops 12.

The outputs 18 of the flip-flops 12 clocked by CLOCKs B and G are input to an OR gate 64. The output of the CLOCK G flip-flop is inverted by inverter 66, although the complement data output (not shown) of the flip-flop 12 may be used rather than inverting the output with the inverter 66. The output of the OR gate 64 provides an EXCESSIVE LATENCY DRIFT signal to the control logic 70. The operation of the control logic 70 upon receipt of an EXCESSIVE LATENCY DRIFT signal is described in further detail in connection with FIG. 5 below.

Referring back to Table 1, it is apparent that either of the outputs shown in rows 2 or 3 will cause the EXCESSIVE LATENCY DRIFT signal to be generated by the OR gate 64. The choice of the flip-flops 12 to be connected to the OR gate 64, which corresponds to the choice of the phase upon which recalibration will be triggered, is a matter of engineering judgment and is dependent upon the actual timing of the clocks for the flip-flops 12 and the environment in which the invention is used.

Figure 5:
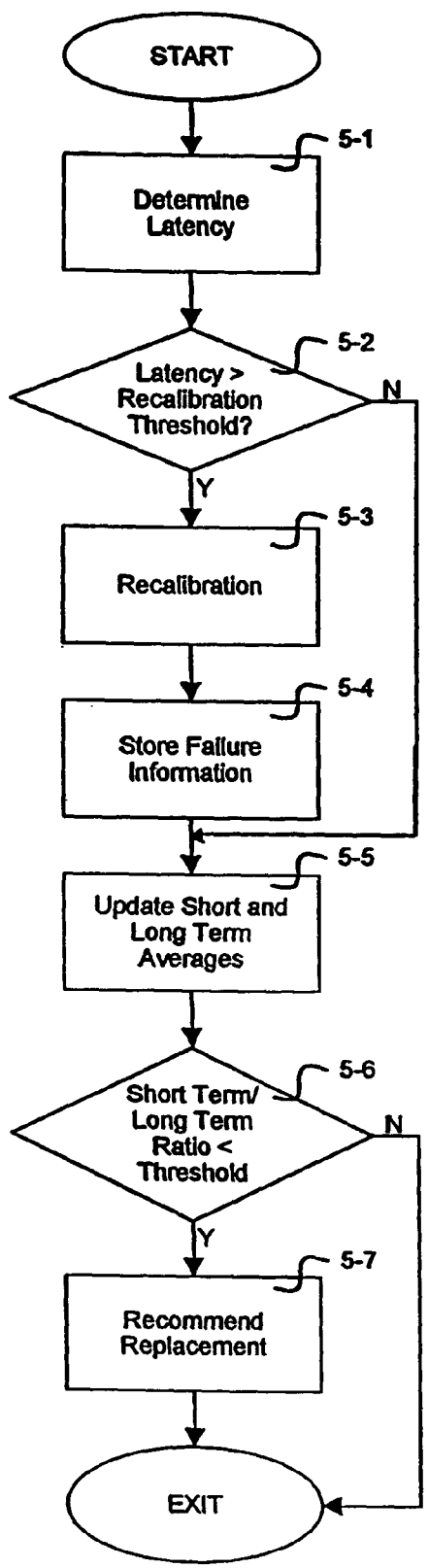
FIG. 5 is a flow chart illustrating a component monitoring procedure.

Referring now to FIG. 5, upon receipt of an EXCESSIVE LATENCY DRIFT signal from the OR gate 64, the control logic 70 determines the latency drift of the SLDRAM memory circuit at step 5-1 by reading the phase detector 10 of the phase detector-monitor circuit 60. This latency is compared to a recalibration threshold at step 5-2. The recalibration threshold may be a simple threshold which may be set so that recalibration is automatically performed every time an occurrence of an excessive drift is detected. The threshold may also be a more sophisticated threshold, and may be set so that calibration only occurs if a predetermined number of excessive drifts occur within a predetermined time period. The threshold may also depend upon the magnitude of the latency drift. This is one reason why it is desirable to provide a phase detector with multiple flip-flops, rather than a phase detector with only two flip-flops. If the component latency exceeds the recalibration threshold, recalibration is performed at step 5-3.

If the latency drift does not exceed the recalibration threshold, or after recalibration has been performed, latency drift information is stored in the memory 50 at step 5-4. Latency drift information consists of, at a minimum, the time, taken from an onboard clock (not shown), and identification of the component exhibiting the excessive latency drift. The the amount and direction of latency drift, as well as the location of the component exhibiting the excessive drift, may also be stored. Which information is stored is dependent upon the environment and is a matter of engineering judgment.

Next, the response time "history" of the SLDRAM memory circuit 30 is examined to determine whether the SLDRAM memory circuit 30 has begun to exhibit marginal behavior possibly indicative of an impending failure. One possible way to express this latency drift history is in the form of long and short term averages of the time between excessive latency drifts. The averages could be maintained using a simple alpha filter of the form:

$$AVG_n = (\text{Drift Time}/\text{alpha}) + (AVG_{n-1} * (1 - (1/\text{alpha})))$$

In the above equation, $AVG_n$ represents the new average time between excessiv latency drifts; $AVG_{n-1}$ represents the previous average time between excessive latency drifts, Drift Time represents the time between the currently observed excessive latency drift and the previously observed excessive latency drift, and alpha is a constant. A large alpha value is selected for the long term average, while a small alpha value is selected for the short term average. For example, alphas of 8 and 128 might be chosen for the short and long term values, respectively. The actual alphas chosen depend upon the actual SLDRAM devices themselves and are a matter of engineering judgment.

Figure 7:
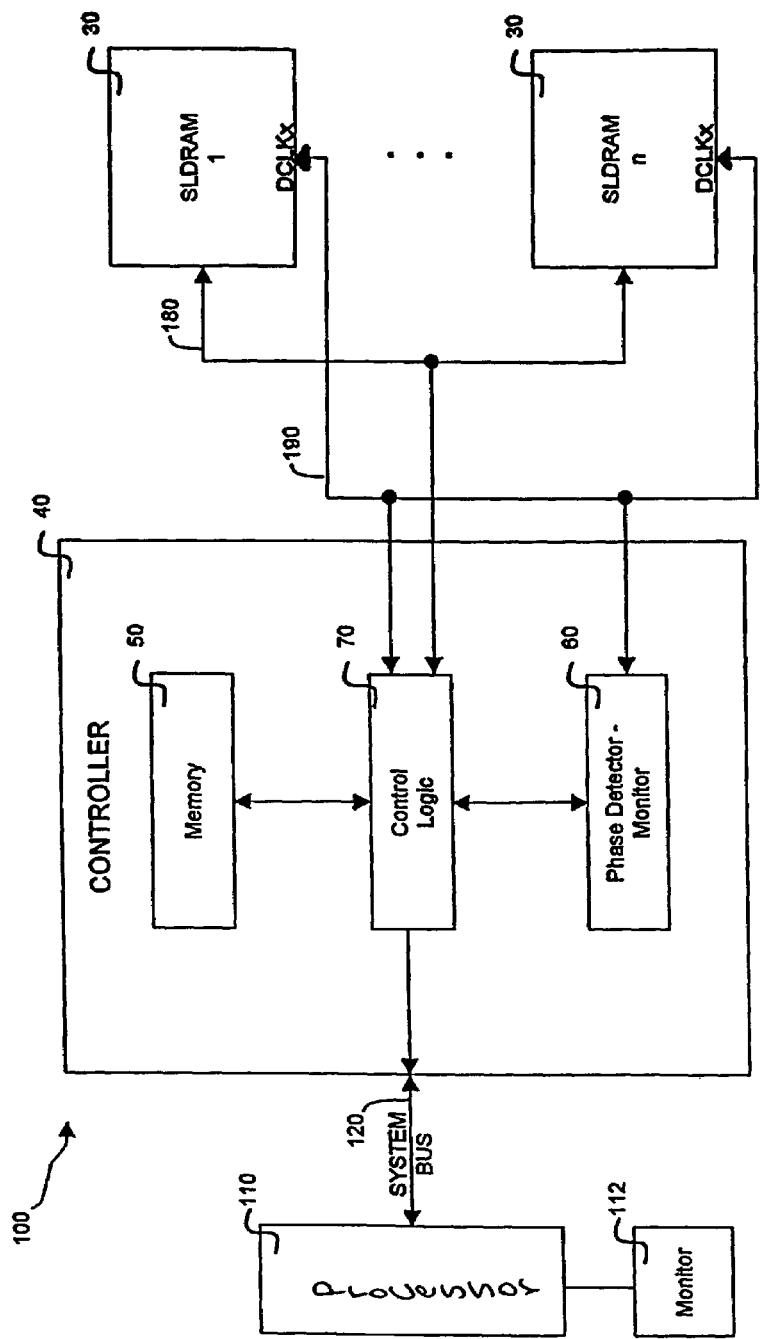
FIG. 7 is a block diagram of a computer system incorporating the memory controller of FIG. 3.

The aforementioned averages are calculated at step 5-5. Next, the ratio of the short term average to the long term average is compared to a threshold at step 5-6. The threshold value is a constant between 0 and 1. This comparison determines whether the component has recently begun exhibiting excessive drifts. For example, a ratio of 0.25 signifies a "recent" four-fold decrease in the average time between excessive latency drifts of an SLDRAM memory circuit 30. If the threshold value is exceeded, the controller 40 sends a message to the user to replace the component at step 5-7. This is accomplished by sending a message to the processor 110 via the system bus 120 as shown in FIG. 7 (FIG. 7 will be discussed in greater detail below). If the threshold is not exceeded, the response time drift is acceptable and does not require corrective action.

The above technique for determining the response time history of the SLDRAM memory circuit 30 is only one among a large number of alternatives. For example, the average latency drift, rather than the average time between latency drifts, could be calculated. Another possible implementation is to measure a combination of the frequency and magnitude of the excessive latency drifts. Still another possible implementation is determine what percentage of the detected excessive latency drifts have been caused by the particular SLDRAM memory circuit 30. The "history" of the component could be determined using standard deviation calculations rather than long and short term averages. Preventive maintenance could be triggered by a user message when the number of successive drifts above a threshold based on the standard deviation exceeds a certain value. Many other techniques for determining the response time history are also possible.

The aforementioned technique requires the failure data to be stored in the memory 50. Such storage could be temporary, such as in volatile memory. However, if volatile memory is used, the failure data would be lost each time the system is turned off. Non-volatile memory, such as in flash memory or battery backed-up RAM, may be used to retain the failure information while the system is turned off.

The operation illustrated by FIG. 5 is only performed when the OR gate 64 generates an EXCESSIVE LATENCY DRIFT signal. However, in other environments and applications, it may be desirable to read the latency drift from the phase detector 10 even when an EXCESSIVE LATENCY DRIFT signal is not present. For example, the phase detector 10 may be read periodically, or for each memory read command. In such embodiments, reading the latency drift allows the control logic 70 to observe both normal and excessive drifts in latencies. The choice of when to read the phase detector 10 depends upon the application and is a matter of engineering judgment.

Figure 6:
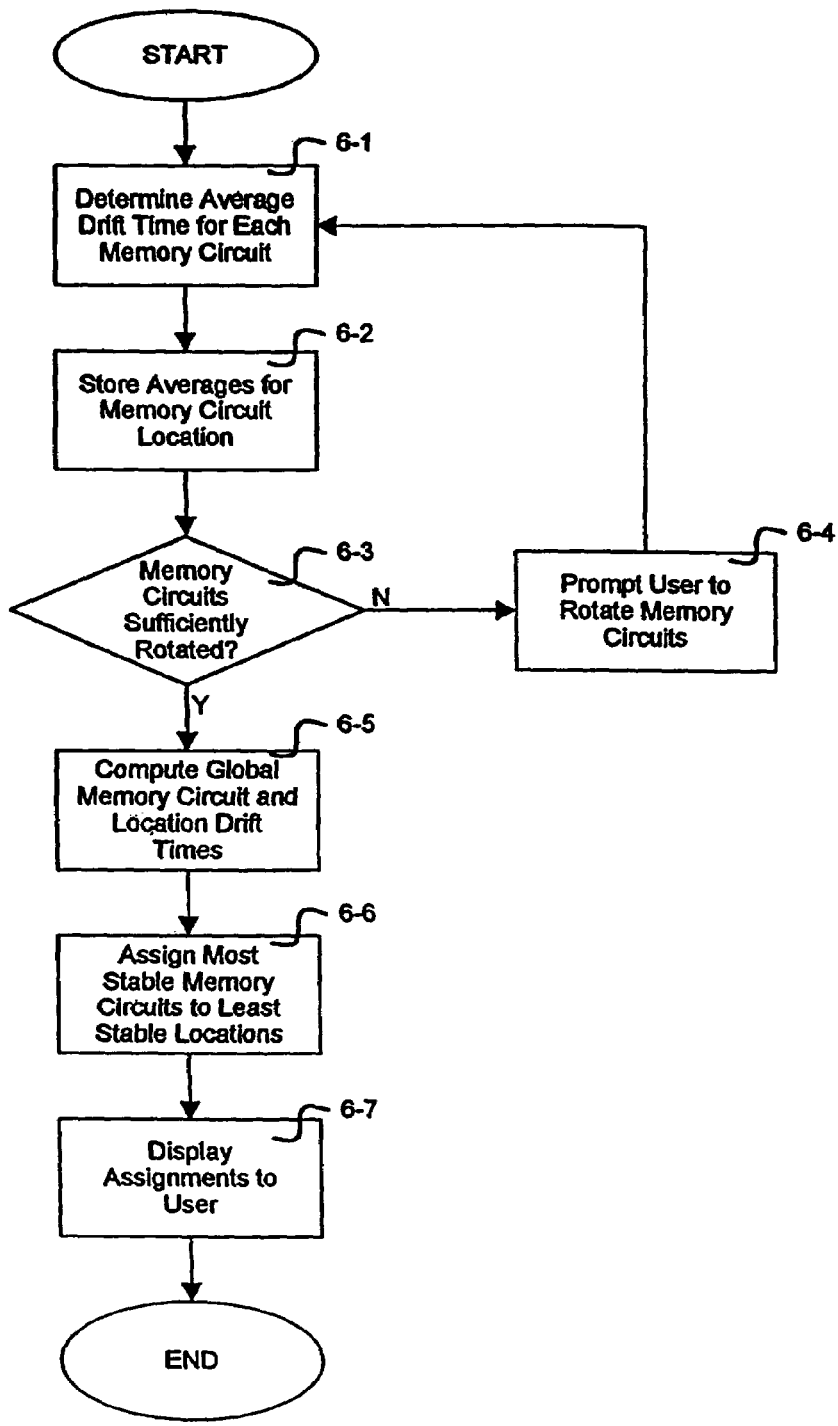
FIG. 6 is a flow chart illustrating a preventive maintenance procedure.

The response time drift data could also be used by the controller 40 to perform more sophisticated system preventive maintenance and performance enhancement. An example of such a technique is illustrated in FIG. 6. The procedure illustrated by FIG. 6 is the identification of memory circuits that exhibit the least latency drift (the most stable components) and the physical locations for memory circuits in the system that cause the most latency drift (the worst locations) and the placement of the most stable components in the "worst" locations.

Some locations may be worse than others due to environmental conditions such as temperature. For example, the air flow in particular locations may be less than in others, resulting in higher temperatures at that location. Other locations may be near system components, such as power supplies, that give off excessive heat or otherwise cause electrical signal aberrations. Other environmental conditions that might cause component response times to drift include power supply fluctuations, which also may be position dependent.

The controller 40 determines the average time between excessive latency drift, also known as the average drift time, for each memory circuit at step 6-1. The average drift time is determined over a predetermined period of time. The average drift time for each memory circuit and the location of each memory circuit is stored at step 6-2. If each memory circuit has not yet been rotated to a sufficient number of other locations in the system at step 6-3, the system prompts the user to rotate the memory circuits at step 6-4. The number of locations sufficient to obtain averages of memory circuit drift times that are independent of the location of the memory circuit depends upon the physical characteristics of the particular system. For example, one system may have very little variation in temperature. In such a system, determining the average drift time in just two locations may be sufficient to identify the least stable memory circuits. The actual number of locations that are sufficient is therefore a matter of engineering judgment.

Because step 6-4 requires an actual physical rotation of the memory circuits, power-down may be necessary. Therefore, the memory circuit and location averages must be stored in some form of non-volatile memory on the controller itself, or on some form of permanent system storage such as a hard disk.

Once all memory circuits have been rotated to a sufficient number of locations, "global" averages are calculated for each memory circuit and for each location at step 6-5. The global average for each memory circuit is the average of the average drift time for that memory circuit at each location. The global average for each location is the average of each memory circuit drift time at that location. In other words, if there are N memory circuits and locations, then the global average for the memory circuit is the average drift time of that memory circuit in each of the N locations, and the global average for the location is the average drift time of each of the N memory circuits while each memory circuit was at that location. When the global averages are calculated in this fashion, they represent the average memory circuit drift time independent of location, and the average location drift time independent of memory circuit, respectively.

At step 6-6, the most stable memory circuits are assigned to the least stable locations. Said another way, the memory circuits having the longest global drift times are assigned to the locations having the shortest global drift times. The results of this assignment are displayed to the user at step 6-7. Configuring the system in this manner improves performance because the necessity for recalibration, during which the system is unable to access the components, is minimized. Configuring the system in this manner also improves reliability, because the most sensitive memory circuits are placed in the most benign locations.

The foregoing procedure could be performed as part of a periodic preventive maintenance schedule. In this fashion, as memory circuit drift times are degraded due to exposure to relatively harsh environments, they are rotated out of these locations and replaced by other components. Similarly, once relatively harsh locations are identified by the foregoing procedure, memory circuits may be evenly rotated in and out of these locations.

The procedure could also be performed whenever the system is reconfigured in such a way that environmental characteristics may be changed, such as by adding an expansion card, or when memory circuits are replaced or added.

Another method for enhancing performance is to measure the response time for all devices and associating the devices with the fastest response times with those locations that are accessed most frequently. The association may be accomplished either physically (by physically placing the components in desired locations) or logically (by assigning logical addresses to the components/locations).

FIG. 7 illustrates a system 100 incorporating the memory controller 40 of FIG. 3. A processor 110 interfaces with the controller 40 via a system bus 120. The processor 120 communicates read and write requests to the controller 40 on the system bus 120. The controller 40 also communicates informational prompts to the user, such as notices that a memory circuit may be going bad or to rotate a component, to the processor 110 via the system bus 120. The processor 110 then displays these prompts on the monitor 112. The controller 40 includes local memory 50 and a phase detector-monitor circuit 60 connected to control logic 70. A plurality of SLDRAM memory circuits 30 are connected to the controller 40 by a DCLKx signal 190 and a communication path 180. The communication path 180 includes all of the remaining signals required for the control logic 70 to interface with the SLDRAM memory circuits 30, including the command path, data path, and CCLK signal discussed in connection with FIG. 3.

It should again be noted that although the invention has been described with specific reference to memory circuits as the electronic components whose response time is monitored, the invention has broader applicability and may be used in the fashion described above to check the response time of any electronic component to an issued command. For example, it could be used to determine the response time of flash memories, CD readers, hard disks, or other electronic components.

Accordingly, the above description and accompanying drawings are only illustrative of pr ferred embodiments which can achieve and provide the objects, features and advantages of the present invention. It is not intended that the invention be limited to the embodiments shown and described in detail herein. The invention is only limited by the spirit and scope of the following claims.

The invention claimed is:

1. A method of generating a latency drift signal comprising the steps of:
   generating a first signal for indicating that data requested has been received;
   generating a plurality of derivative signals from said first signal, said plurality of derivative signals corresponding to a plurality of states of said first signal at a respective plurality of times;
   comparing at least two of said derivative signals; and
   generating a latency drift signal when said at least two of said derivative signals exhibit a predetermined relationship.

2. The method of claim 1, further comprising inputting said plurality of derivative signals into a plurality of delay circuits.

3. The method of claim 1, wherein said at least two of said derivative signals are compared using an OR gate.

4. The method of claim 1, wherein said latency drift signal is used to determine a latency drift in a memory circuit.

5. The method of claim 1, wherein said derivative signals are delayed relative to said first signal.

6. The method of claim 5, wherein each of said derivative signals is delayed relative to a preceding derivative signal.

7. A method of generating a latency drift signal comprising the steps of:
   receiving a master clock signal at a first clock input of a latency detection circuit, said master clock signal being adapted to indicate a first start time of a signal response window, said signal response window including a first time interval of a first duration;

receiving a transaction status signal at a second transaction status input of said latency detection circuit during said first time interval;

sampling a state of said transaction status signal with said latency detection circuit at a plurality of sampling times within said first time interval; and receiving a latency status signal from said latency detection circuit at a control device, said latency status signal corresponding to a state of said transaction status signal at one or more of said plurality of sampling times.

8. The method of claim 7 further comprising indicating to said control device a moderate latency increasing status by said received latency status signal.

9. The method of claim 7 further comprising indicating to said control device an excessive latency increasing status by said received latency status signal.

10. The method of claim 7 further comprising indicating to said control device a moderate latency decreasing status by said received latency status signal.

11. The method of claim 7 further comprising indicating to said control device an excessive latency decreasing status by said received latency status signal.

12. The method of claim 7, wherein said plurality of sampling times comprises at least four sampling times.

13. A latency drift detector comprising:
means for receiving a ready signal of a programmable response time memory component whose response time is being measured;
means for generating a plurality of data outputs derived from said ready signal, said plurality of data outputs indicating a respective time within a response window from a plurality of clock signals;
means for determining a latency drift based on said plurality of data outputs; and
means for recalibrating at least one programmable response time memory component when said determined latency drift exceeds a predetermined threshold.

14. The detector of claim 13, further comprising a messaging means for indicating to a user a status of said memory component.

15. The detector of claim 13, wherein said determining means utilizes long term averaging.

16. The detector of claim 13, wherein said determining means utilizes short term averaging.

17. The detector of claim 13, wherein said determining means generates latency drift data for a plurality of memory components.

18. The detector of claim 17, wherein said latency drift data is utilized for preventative maintenance.

19. A method of increasing reliability of an electronic system comprising:
receiving a master clock signal at a first clock input of a latency detection circuit, said master clock signal being adapted to indicate a first start time of a signal response window, said signal response window including a first time interval of a first duration;
receiving a transaction status signal at a second transaction status input of said latency detection circuit during said first time interval;
sampling a state of said transaction status signal with said latency detection circuit at a plurality of sampling times within said first time interval;
receiving a latency status signal from said latency detection circuit at a control device, said latency status signal corresponding to a state of said transaction status signal at one or more of said plurality of sampling times; and
servicing a component corresponding to said transaction status signal based on a state of said latency status signal received at said control device.

20. The method of claim 19, wherein said servicing a component comprises replacing said component.

21. The method of claim 19, wherein said servicing a component comprises transferring said component from a preferred system environment to a non-preferred system environment.

22. The method of claim 19, wherein said servicing a component comprises transferring said component from a non-preferred system environment to a preferred system environment.

23. The method of claim 19, wherein said servicing a component comprises notifying a user of a status of said component.

24. The method of claim 19, wherein said servicing a component comprises calculating a latency time statistic corresponding to said status of said component.

25. The method of claim 24 further comprising storing a latency time interval value in a system memory.

* * * * *